(12) United States Patent
Ludemann et al.

(10) Patent No.: US 9,156,939 B2
(45) Date of Patent: Oct. 13, 2015

(54) POLYMER CONTAINING ALDEHYDE GROUPS, REACTION AND CROSSLINKING OF THIS POLYMER, CROSSLINKED POLYMER, AND ELECTROLUMINESCENT DEVICE COMPRISING THIS POLYMER

(75) Inventors: Aurélie Ludemann, Frankfurt (DE); Rémi Manouk Anémian, Frankfurt (DE); Alice Julliart, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 1008 days.

(21) Appl. No.: 13/203,506

(22) PCT Filed: Feb. 1, 2010

(86) PCT No.: PCT/EP2010/000590
§ 371 (c)(1),
(2), (4) Date: Aug. 26, 2011

(87) PCT Pub. No.: WO2010/097155
PCT Pub. Date: Sep. 2, 2010

(65) Prior Publication Data
US 2011/0303876 A1 Dec. 15, 2011

(30) Foreign Application Priority Data

Feb. 27, 2009 (DE) .................. 10 2009 010 713
Dec. 22, 2009 (DE) .................. 10 2009 059 985

(51) Int. Cl.
| | | |
|---|---|---|
| C09K 11/02 | (2006.01) |
| H01B 1/00 | (2006.01) |
| C08F 283/00 | (2006.01) |
| C08G 61/02 | (2006.01) |
| C08G 2/00 | (2006.01) |
| C08G 12/06 | (2006.01) |
| C08G 61/12 | (2006.01) |
| C09D 165/00 | (2006.01) |
| C09K 11/06 | (2006.01) |
| H05B 33/14 | (2006.01) |
| H01L 51/00 | (2006.01) |
| H01L 51/50 | (2006.01) |

(52) U.S. Cl.
CPC .............. *C08G 61/12* (2013.01); *C09D 165/00* (2013.01); *C09K 11/06* (2013.01); *H01L 51/0043* (2013.01); *H05B 33/14* (2013.01); *C09K 2211/1433* (2013.01); *C09K 2211/1466* (2013.01); *H01L 51/0039* (2013.01); *H01L 51/5012* (2013.01); *Y02E 10/549* (2013.01)

(58) Field of Classification Search
None
See application file for complete search history.

(56) References Cited

U.S. PATENT DOCUMENTS

| | | |
|---|---|---|
| 5,518,824 A | 5/1996 | Funhoff et al. |
| 6,982,179 B2 | 1/2006 | Kwong et al. |
| 7,285,432 B2 | 10/2007 | Kwong et al. |
| 2004/0133004 A1 | 7/2004 | Stossel et al. |
| 2004/0135131 A1 | 7/2004 | Treacher et al. |
| 2004/0138455 A1 | 7/2004 | Stossel et al. |
| 2004/0206939 A1 | 10/2004 | Spreitzer et al. |
| 2004/0225056 A1 | 11/2004 | Spreitzer et al. |
| 2004/0260090 A1 | 12/2004 | Treacher et al. |
| 2006/0058494 A1 | 3/2006 | Busing et al. |
| 2006/0127696 A1 | 6/2006 | Stossel et al. |
| 2006/0229427 A1 | 10/2006 | Becker et al. |
| 2006/0284140 A1 | 12/2006 | Breuning et al. |
| 2007/0060736 A1 | 3/2007 | Becker et al. |
| 2007/0135635 A1 | 6/2007 | Stossel et al. |
| 2007/0154732 A1 | 7/2007 | Kitano et al. |
| 2007/0228364 A1 | 10/2007 | Radu et al. |
| 2007/0290194 A1 | 12/2007 | Becker et al. |
| 2008/0071049 A1 | 3/2008 | Radu et al. |
| 2009/0072200 A1* | 3/2009 | Heeney et al. ............... 252/500 |
| 2010/0102305 A1 | 4/2010 | Heun et al. |
| 2011/0068304 A1 | 3/2011 | Parham et al. |
| 2011/0127517 A1 | 6/2011 | Nakatani |
| 2012/0077955 A1 | 3/2012 | Radu et al. |

FOREIGN PATENT DOCUMENTS

| | | |
|---|---|---|
| AU | 2002367422 | 7/2003 |
| EP | 0438201 | 7/1991 |
| EP | 0637899 | 2/1995 |
| EP | 1 239 526 | 9/2002 |
| JP | 04218340 | 8/1992 |
| JP | 2003-253001 | 9/2003 |
| JP | 2003-253001 A | 9/2003 |

(Continued)

OTHER PUBLICATIONS

JP-2011551425 office action mailed Sep. 3, 2013 (family of U.S. Appl. No. 13/203,506).

(Continued)

*Primary Examiner* — Harold Pyon
*Assistant Examiner* — Jaison Thomas
(74) *Attorney, Agent, or Firm* — Drinker Biddle & Reath LLP

(57) ABSTRACT

The present invention relates to a polymer which comprises at least one structural unit which contains at least one aldehyde group, and to a process for the preparation of a crosslinkable or crosslinked polymer including a polymer which contains aldehyde groups. The present invention thus also relates to a crosslinkable polymer and a crosslinked polymer which is prepared by the process according to the invention, and to the use of this crosslinked polymer in electronic devices, in particular in organic electroluminescent devices, so-called OLEDs (OLED=organic light emitting device).

8 Claims, No Drawings

(56) References Cited

FOREIGN PATENT DOCUMENTS

| | | |
|---|---|---|
| JP | 2006-152014 | 6/2006 |
| JP | 2008163306 A | 7/2008 |
| JP | 2010053349 A | 3/2010 |
| JP | 2012511080 A | 5/2012 |
| WO | WO-96/20253 | 7/1996 |
| WO | WO-02/067343 | 8/2002 |
| WO | WO-02/068435 | 9/2002 |
| WO | WO-02/072714 | 9/2002 |
| WO | WO-02/077060 | 10/2002 |
| WO | WO-02/081488 | 10/2002 |
| WO | WO-03/019694 | 3/2003 |
| WO | WO-03/048225 | 6/2003 |
| WO | WO-03/057762 | 7/2003 |
| WO | WO-2004/026886 | 4/2004 |
| WO | WO-2004/037887 | 5/2004 |
| WO | WO-2004/070772 | 8/2004 |
| WO | WO-2004/113468 | 12/2004 |
| WO | WO-2005/014688 | 2/2005 |
| WO | WO-2005/014689 | 2/2005 |
| WO | WO-2005/026144 | 3/2005 |
| WO | WO-2005/040302 | 5/2005 |
| WO | WO-2005/042548 | 5/2005 |
| WO | WO-2005/049689 | 6/2005 |
| WO | WO-2005/052027 | 6/2005 |
| WO | WO-2005/083812 | 9/2005 |
| WO | WO-2006/043087 | 4/2006 |
| WO | WO-2010/065178 | 6/2010 |

OTHER PUBLICATIONS

Fang, Q., et al., "New Alternative Copolymer Constituted of Fluorene and Triphenylamine Units with a Tunable –CHO Group in the Side Chain. Quantitative Transformation of the –CHO Group to –CH=CHAr Groups and Optical and Electrochemical Properties of the Polymers," Macromolecules (2004), vol. 37, pp. 5894-5899.

Xia, H., et al., "A facile convergent procedure for the preparation of triphenylamine-based dendrimers with truxene cores," Tetrahedron (2008), vol. 64, pp. 5736-5742.

International Search Report in parent PCT application No. PCT/EP2010/000590 (WO 2010/097155) Apr. 8, 2010.

* cited by examiner

POLYMER CONTAINING ALDEHYDE GROUPS, REACTION AND CROSSLINKING OF THIS POLYMER, CROSSLINKED POLYMER, AND ELECTROLUMINESCENT DEVICE COMPRISING THIS POLYMER

CROSS-REFERENCE TO RELATED APPLICATIONS

This application is a national stage application (under 35 U.S.C. §371) of PCT/EP2010/000590, filed Feb. 1, 2010, which claims benefit of German application 10 2009 059 985.1, filed Dec.22, 2009 and German application 10 2009 010 713.4, filed Feb.27, 2009.

BACKGROUND OF THE INVENTION

The present invention relates to a polymer which comprises at least one structural unit which contains at least one aldehyde group, and to a process for the preparation of a crosslinkable and/or crosslinked polymer including a polymer which contains aldehyde groups. The process according to the invention for the preparation of a crosslinked polymer including a polymer containing aldehyde groups results in polymers having an excellent degree of crosslinking. The present invention thus also relates to a crosslinked polymer which is prepared by the process according to the invention, to the use of this crosslinked polymer in electronic devices, in particular in organic electroluminescent devices, so-called OLEDs (OLED=organic light emitting diode), and to organic electroluminescent devices comprising this crosslinked polymer. The present invention also relates to the use of the polymer containing aldehyde groups according to the invention for the preparation of a polymer containing vinyl or alkenyl groups or of a cross-linked polymer.

In opto-electronic devices, such as OLEDs, in particular PLEDs (polymeric light emitting diodes), components having different functionalities are required. In PLEDs, the dirrefent functionalities are normally present in different polymer layers. In this case, the term multilayered OLED systems is used. These multilayered OLED systems comprise—inter alia—charge-transporting layers, such as electron- and hole-conductor layers, and layers which comprise light-emitting components. These multilayered OLED systems are generally prepared by the successive layer-wise application of polymer solutions which comprise polymers having the various functionalities, and crosslinking of the respective polymer layer applied in order to make it insoluble before the next layer is applied. Such processes are described, for example, in EP 0 637 899 and WO 96/20253.

In the majority of cases, the crosslinking group is bonded directly to a monomer, which then becomes part of a crosslinkable polymer through polymerisation. This preparation route for crosslinked polymers is described, for example, in WO 2006/043087, WO 2005/049689, WO 2005/052027 and US 2007/0228364. The problem associated with the polymerisation of monomers which already carry a crosslinkable group during the polymerisation is undesired crosslinking even during preparation of the polymer. In order to avoid these disadvantages, it is accordingly necessary for the crosslinkable group to remain stable under the polymerisation conditions and not to undergo reactions in order only subsequently to be able to contribute specifically to the crosslinking. Usual polymerisation conditions, such as, for example, in Stille, Suzuki or Yamamoto coupling, require higher temperatures than room temperature. At these temperatures, crosslinkable groups may, even during the polymerisation, undergo undesired side reactions with further crosslinking monomers and/or any further comonomers present. This may restrict the processability of the polymer, result in material defects and lower the performance and/or capacity of the resultant devices. These problems are not satisfactorily solved by the processes used in the prior art.

BRIEF SUMMARY OF THE INVENTION

Accordingly, it was an object of the present invention to find a way of avoiding side reactions of the crosslinkable group during the polymerisation of monomers, so that the polymerisation proceeds without interference, and the polymer obtained has the desired number of crosslinkable groups.

The object according to the invention is achieved firstly by the provision of a polymer which does not itself carry any crosslinkable groups, but contains groups which can be converted easily and quantitatively into crosslinkable groups.

The present invention thus relates to a polymer which comprises at least one structural unit of the following formula (I):

formula (I)

which is characterised in that at least one representative from Ar and Ar', preferably Ar', contains an aldehyde group,
where the symbols and indices used have the following meanings:
Ar and Ar' represent, independently of one another, a substituted or unsubstituted, mono- or polycyclic, aromatic or heteroaromatic ring system;
X represents a covalent single bond or a straight-chain, branched or cyclic $C_{1-10}$-alkylene, $C_{1-10}$-alkenylene or $C_{1-10}$-alkynylene group, in which one or more H atoms may be replaced by F and in which one or more $CH_2$ groups may be replaced by O, NH or S; and
n is 1, 2, 3 or 4, preferably 1 or 2 and particularly preferably 1; and
the dashed lines represent bonds to the next structural unit of the polymer.

A DETAILED DESCRIPTION OF THE INVENTION

In the present invention, the term "structural unit" is taken to mean a monomer unit which is incorporated into the polymer backbone as part thereof by reaction at two ends by bond formation, and is thus present as recurring unit in the polymer prepared.

In the present application, the term polymer is taken to mean both polymeric compounds, oligomeric compounds and dendrimers. The polymeric compounds according to the invention preferably comprise 10 to 10,000, particularly preferably 20 to 5000 and in particular 50 to 2000, structural units. The oligomeric compounds according to the invention preferably comprise 3 to 9 structural units. The branching factor of the polymers here is between 0 (linear polymer, no branching points) and 1 (fully branched dendrimer).

In the present application, the term "dendrimer" is intended to be taken to mean a highly branched compound built up from a multifunctional centre (core), to which branched monomers are bonded in a regular structure, giving a tree-like structure. Both the core and also the monomers here can adopt any desired branched structures, which consist both of purely organic units and also organometallic compounds or coordination compounds. "Dendrimer" here is generally intended to be understood as described, for example, by M. Fischer and F. Vögtle (*Angew. Chem., Int. Ed.* 1999, 38, 885).

In the present invention, "substituted or unsubstituted, mono- or polycyclic, aromatic ring system" is taken to mean an aromatic ring system, preferably having 6 to 60, particularly preferably 6 to 30, very particularly preferably 6 to 14 and especially preferably 6 to 10, aromatic ring atoms, which does not necessarily contain only aromatic groups, but instead in which, in addition, a plurality of aromatic units may be interrupted by a short non-aromatic unit (<10% of the atoms other than H, preferably <5% of the atoms other than H), such as, for example, $sp^3$-hybridised C atom or O or N atom, CO group, etc. Thus, for example, systems such as 9,9'-spirobifluorene, 9,9-diarylfluorene, etc., are also intended to be taken to be aromatic ring systems.

The aromatic ring systems can be monocyclic or polycyclic, i.e. they can contain one ring (for example phenyl) or a plurality of rings, which may also be condensed (for example naphthyl) or covalently bonded (for example biphenyl), or contain a combination of condensed and bonded rings. However, particular preference is given to fully condensed systems.

Preferred aromatic ring systems are, for example, phenyl, biphenyl, triphenyl, 1,1':3',1''-terphenyl-2'-yl, naphthyl, anthracene, binaphthyl, phenanthrene, dihydrophenanthrene, pyrene, dihydropyrene, chrysene, perylene, tetracene, pentacene, benzopyrene, fluorene, indene, indenofluorene and spirobifluorene.

In the present invention, the term "substituted or unsubstituted, mono- or polycyclic, heteroaromatic ring system" is taken to mean an aromatic ring system, preferably having 5 to 60, particularly preferably 5 to 30, very particularly preferably 5 to 20 and especially preferably 5 to 9, aromatic ring atoms, where one or more of these atoms is/are a heteroatom.

The "substituted or unsubstituted, mono- or polycyclic, heteroaromatic ring system" does not necessarily contain only aromatic groups, but instead may also be interrupted by a short non-aromatic unit (<10% of the atoms other than H, preferably <5% of the atoms other than H), such as, for example, $sp^a$-hybridised C atom or O or N atom, CO group, etc.

The heteroaromatic ring systems may be monocyclic or polycyclic, i.e. they can contain one ring or a plurality of rings, which may also be condensed or covalently bonded (for example pyridylphenyl), or contain a combination of condensed and bonded rings. Preference is given to fully conjugated heteroaryl groups. However, particular preference is given to fully condensed systems.

Preferred heteroaromatic ring systems are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]-thiophene, thieno[3,2b]thiophene, dithienothiophene, isobenzothiophene, dibenzothiophene, benzothiadiazothiophene, or combinations of these groups. The heteroaryl groups may also be substituted by alkyl, alkoxy, thioalkyl, fluorine, fluoroalkyl or further aryl or heteroaryl groups.

The substituted or unsubstituted mono- or polycyclic aromatic or hetero-aromatic ring system optionally has one or more substituents, which are preferably selected from the group consisting of silyl, sulfo, sulfonyl, formyl, amine, imine, nitrile, mercapto, nitro, halogen, $C_{1-12}$-alkyl, $C_{6-12}$-aryl, $C_{1-12}$-alkoxy, hydroxyl, or combinations of these groups.

Preferred substituents are, for example, solubility-promoting groups, such as alkyl or alkoxy, electron-withdrawing groups, such as fluorine, nitro or nitrile, or substituents for increasing the glass transition temperature (Tg) in the polymer, in particular bulky groups, such as, for example, t-butyl or optionally substituted aryl groups.

Particularly preferred substituents are, for example, F, Cl, Br, I, —CN, —NO$_2$, —NCO, —NCS, —OCN, —SCN, —C(=O)N(R)$_2$, —C(=O)Y$^1$, —C(=O)R and —N(R)$_2$, in which R is, independently of one another, H, an aliphatic or aromatic hydro-carbon radical having 1 to 20 C atoms, and Y$^1$ denotes halogen, optionally substituted silyl, aryl having 4 to 40, preferably 6 to 20, C atoms, or straight-chain or branched alkyl, alkoxy, alkylcarbonyl, alkoxycarbonyl, alkylcarbonyloxy or alkoxycarbonyloxy having 1 to 22 C atoms, in which one or more H atoms may optionally be replaced by F or Cl.

For the purposes of the present invention, the term "aromatic unit" is taken to mean a moiety which as such forms an aromatic system which, according to the HÜCKEL definition, is a cyclically conjugated system having $(4n+2)\pi$ electrons, where n represents an integer.

A "straight-chain, branched or cyclic $C_{1-10}$-alkylene, $C_{1-10}$-alkenylene or $C_{1-10}$-alkynylene group" is taken to mean saturated or unsaturated aliphatic hydrocarbons, which preferably contain 1 to 10 carbon atoms, particularly preferably 1 to 6 carbon atoms, in which, in addition, one or more CH$_2$ groups may be replaced by NH, O or S and, in addition, one or more H atoms may be replaced by F. Particular preference is given here to linear saturated hydrocarbons having 1 to 6 carbon atoms. Examples of aliphatic hydrocarbons having 1 to 10 carbon atoms include the following: methylene, ethylene, n-propylene, isopropylene, n-butylene, isobutylene, secbutylene (1-methylpropylene), tert-butylene, isopentylene, n-pentylene, tert-pentylene (1,1-dimethylpropyl), 1,2-dimethylpropylene, 2,2-dimethylpropylene (neopentyl), 1-ethylpropylene, 2-methylbutylene, n-hexylene, isohexylene, 1,2-dimethylbutylene, 1-ethyl-1-methylpropylene, 1-ethyl-2-methylpropylene, 1,1,2-trimethylpropylene, 1,2,2-trimethylpropylene, 1-ethylbutylene, 1-methylbutylene, 1,1-dimethylbutylene, 2,2-dimethylbutylene, 1,3-dimethylbutylene, 2,3-dimethylbutylene, 3,3-dimethylbutylene, 2-ethylbutylene, 1-methylpentylene, 2-methylpentylene, 3-methylpentylene, cyclopentylene, cyclohexylene, cycloheptylene, cyclooctylene, 2-ethylhexylene, trifluoromethylene, pentafluoroethylene, 2,2,2-trifluoroethylene, ethenylene, propenylene, butenylene, pentenylene, cyclopentenylene, hexenylene, cyclohexenylene, heptenylene, cycloheptenylene, octenylene, cyclooctenylene, ethynylene, propynylene, butynylene, pentynylene, hexynylene and octynylene.

The proportion of crosslinkable structural units of the formula (I) in the polymer is in the range from 0.01 to 95 mol %, preferably in the range from 0.1 to 70 mol %, particularly preferably in the range from 0.5 to 50 mol % and especially preferably in the range from 1 to 30 mol %, based on 100 mol % of all copolymerised monomers which are present as structural units in the polymer.

In a further preferred embodiment of the present invention, the polymer according to the invention also comprises, besides one or more structural units of the formula (I), at least one further structural unit which is different from the structural unit of the formula (I). These are, inter alia, those as disclosed and listed extensively in WO 02/077060 A1 and in WO 2005/014689 A2. These are incorporated into the present invention by way of reference. The further structural units can originate, for example, from the following classes:

Group 1: Units which enhance the hole-injection and/or hole-transport properties of the polymers;
Group 2: Units which enhance the electron-injection and/or electron-transport properties of the polymers;
Group 3: Units which have combinations of individual units from group 1 and group 2;
Group 4: Units which modify the emission characteristics to such an extent that electrophosphorescence can be obtained instead of electrofluorescence;
Group 5: Units which improve transfer from the so-called singlet state to the triplet state;
Group 6: Units which influence the emission colour of the resultant polymers;
Group 7: Units which are typically used as backbone;
Group 8: Units which influence the film morphology and/or the rheological properties of the resultant polymers.

Preferred polymers according to the invention are those in which at least one structural unit has charge-transport properties, i.e. which comprise units from groups 1 and/or 2.

Structural units from group 1 which have hole-injection and/or hole-transport properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O—, S— or N—containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O—, S— or N—containing heterocycles having a low LUMO (LUMO=lowest unoccupied molecular orbital). These units in the polymer preferably result in an LUMO of less than −2.5 eV (against vacuum level), particularly preferably less than −2.7 eV.

It may be preferred for the polymers according to the invention to comprise units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the production of other emission colours from originally blue-emitting polymers.

Structural units from group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which meet the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as described, for example, in WO 02/068435 A1, WO 02/081488 A1, EP 1239526 A2 and WO 2004/026886 A2. Corresponding monomers are described in WO 02/068435 A1 and in WO 2005/042548 A1.

Structural units from group 5 are those which improve transfer from the singlet state to the triplet state and which, employed in support of the structural elements from group 4, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives or similar compounds, as described, for example, in WO 2005/040302 A1.

Structural units from group 6, besides those mentioned above, are those which have at least one further aromatic structure or another conjugated structure which do not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4'-bi-1,1'-naphthylylene, 4,4'-tolanylene, 4,4'-stilbenylene, 4,4"-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives.

Structural units from group 8 are those which influence the film morphology and/or the rheological properties of the polymers, such as, for example, siloxanes, long alkyl chains or fluorinated groups, but also particularly rigid or flexible units, such as, for example, liquid crystal-forming units or cross-linkable groups.

Preference is given to polymers according to the invention which simultaneously additionally comprise one or more units selected from groups 1 to 8 in addition to structural units of the formula (I). It may likewise be preferred for more than one further structural unit from one group to be present simultaneously.

Preference is given to polymers according to the invention which, besides at least one structural unit of the formula (I), also comprise units from group 7, particularly preferably at least 50 mol % of these units, based on the total number of structural units in the polymer.

It is likewise preferred for the polymers according to the invention to contain units which improve the charge transport or charge injection, i.e. units from groups 1 and/or 2; a proportion of 0.5 to 30 mol % of these units is particularly preferred; a proportion of 1 to 10 mol % of these units is very particularly preferred.

It is furthermore particularly preferred for the polymers according to the invention to comprise structural units from group 7 and units from groups 1 and/or 2, in particular at least 50 mol % of units from group 7 and 0.5 to 30 mol % of units from groups 1 and/or 2.

The polymers according to the invention are either homopolymers comprising structural units of the formula (I) or copolymers. The polymers according to the invention may be linear or branched, preferably linear. Besides one or more structural units of the formula (I), copolymers according to the invention may potentially have one or more further structures from groups 1 to 8 indicated above.

The copolymers according to the invention can have random, alternating or block-like structures or also have a plurality of these structures alternating. The copolymers according to the invention particularly preferably have random or alternating structures. The copolymers are particularly preferably random or alternating copolymers. The way in which copolymers having block-like structures can be obtained and which further structural elements are particularly preferred for this purpose is described in detail, for example, in WO 2005/014688 A2. The latter is incorporated into the present application by way of reference. It should likewise again be emphasised at this point that the polymer may also have dendritic structures.

In a further embodiment, Ar' in the formula (I) is preferably a substituted or unsubstituted unit selected from the group consisting of the following:

phenylene, biphenylene, triphenylene, 1,1':3',1''-terphenyl-2'-ylene, naphthylene, anthracene, binaphthylene, phenanthrene, dihydrophenanthrene, pyrene, dihydropyrene, chrysene, perylene, tetracene, pentacene, benzo[a]pyrene, fluorene, indene, indenofluorene, spirobifluorene, pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]-thiophene, thieno[3,2b]thiophene, dithienothiophene, isobenzothiophene, dibenzothiophene and benzothiadiazothiophene, where the optional substituents are those described above for the aromatic and heteroaromatic ring systems. Naphthylene and phenylene are particularly preferred, with phenylene being particularly preferred.

In still a further embodiment, it is preferred for X in the structural unit of the formula (I) to be a covalent single bond.

A further embodiment of the present invention is also a polymer which comprises at least one structural unit of the following formula (II):

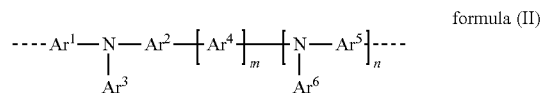

formula (II)

which is characterised in that at least one Ar of the units $Ar^1$ to $Ar^6$ contains an aldehyde group, where the symbols and indices used have the following meanings:
$Ar^1$ to $Ar^6$ are identical or different and represent, independently of one another, a substituted or unsubstituted, mono- or polycyclic, aromatic or heteroaromatic ring system having 5 to 25 ring atoms;
m is 0 or 1;
n is 0, 1 or 2;
the dashed lines represent bonds to the next structural unit of the polymer;
with the proviso that, if n=1, the two N atoms bond to different C atoms of the same aromatic ring system.

In the case of n=2, the two structural elements present in the corresponding square brackets can either be arranged in series, which results in a linear structural unit of the formula (II), or can be arranged in parallel (i.e. both on $Ar^2$ or $Ar^4$), which results in a branched structural unit of the formula (II).

In a further embodiment of the present invention, it is preferred for $Ar^1$ to $Ar^6$ to be selected, independently of one another, identically or differently, from the group consisting of:

phenylene, biphenylene, triphenylene, 1,1':3',1''-terphenyl-2'-ylene, naphthylene, anthracene, binaphthylene, phenanthrene, dihydrophenanthrene, pyrene, dihydropyrene, chrysene, perylene, tetracene, pentacene, benzo[a]pyrene, fluorene, indene, indenofluorene, spirobifluorene, pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]-thiophene, thieno[3,2b]thiophene, dithienothiophene, isobenzothiophene, dibenzothiophene and benzothiadiazothiophene, where the optional substituents are those described above for the aromatic and heteroaromatic ring systems. Naphthylene and phenylene are particularly preferred, with phenylene being especially preferred.

In a further embodiment of the present invention, it is particularly preferred for Ar in the formula (I) or $Ar^1$, $Ar^2$, $Ar^4$ and $Ar^5$ in the formula (II) to be a substituted or unsubstituted unit selected from the group consisting of the following:

4,5-dihydropyrene, 4,5,9,10-tetrahydrofluorene, 9,9'-spirobifluorene, fluorene, phenanthrene, 9,10-dihydrophenanthrene, 5,7-dihydrodibenzoxepine, cis-indenofluorene, trans-indenofluorene, phenylene, thiophene, benzanthracene, carbazole, benzimidazole, oxepine and triazine.

In addition, it is preferred for the polymer of the present invention to comprise, as further structural unit, a structural unit of the formula (I) and/or (II) which, however, does not contain an aldehyde group.

Furthermore, the structural unit in the formula (II) of the polymer according to the invention preferably contains an aldehyde group on the radical $Ar^3$ and/or $Ar^6$, and the structural unit Ar' in the formula (I) of the polymer according to the invention contains an aldehyde group. The groups $Ar^3$, $Ar^6$ and Ar' preferably represent a phenyl group, which may contain an aldehyde group. The aldehyde group can be in the ortho-, meta- or para-position to the phenyl group. The aldehyde group is preferably in the para-position.

In a further embodiment of the present invention, it is preferred for one of the radicals $Ar^1$, $Ar^2$ and $Ar^3$ to be other than phenyl if m and n in formula (II) are equal to zero. In this case, it is preferred for $Ar^1$ and/or $Ar^2$ to be other than phenyl.

In a particularly preferred embodiment, the polymer according to the invention comprises at least one of the following structural units:

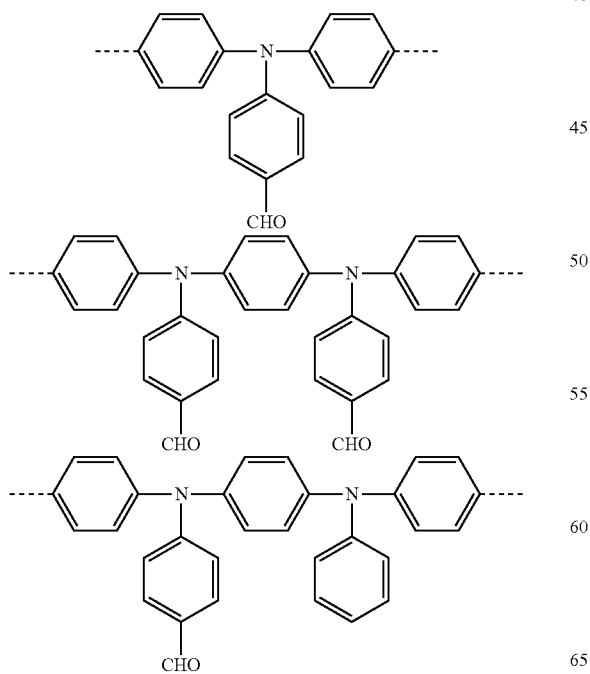

In a further embodiment of the present invention, the polymer preferably comprises one or more of the following structural units:

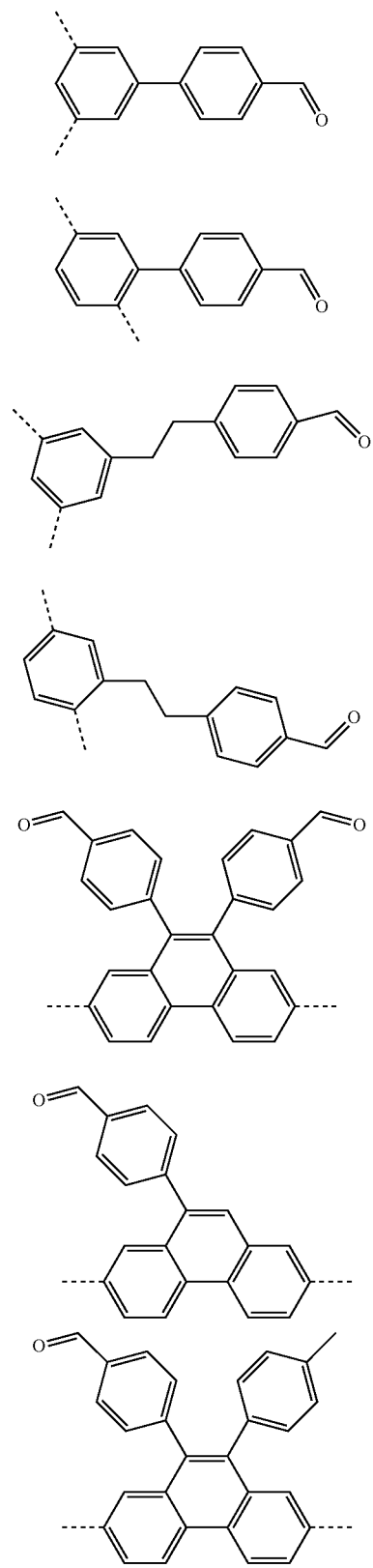

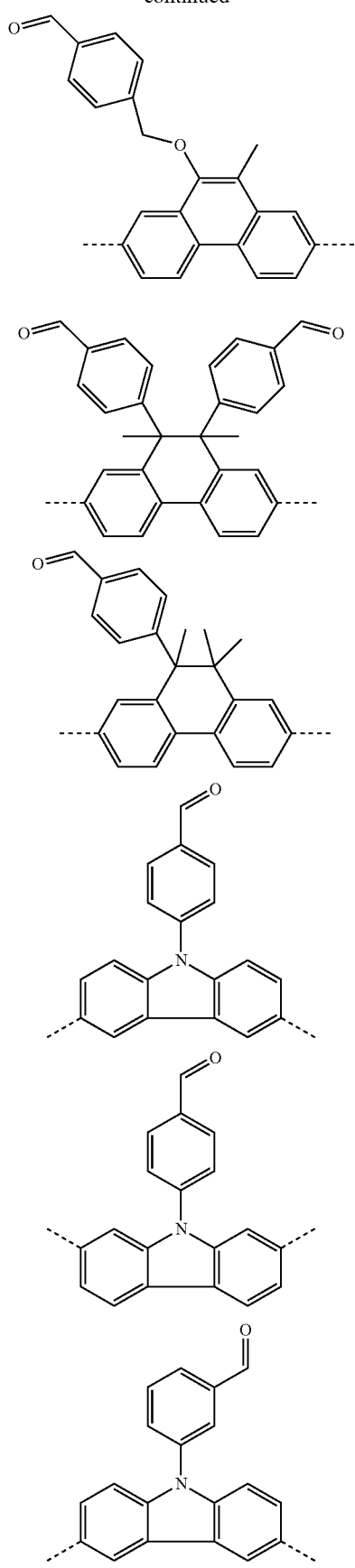
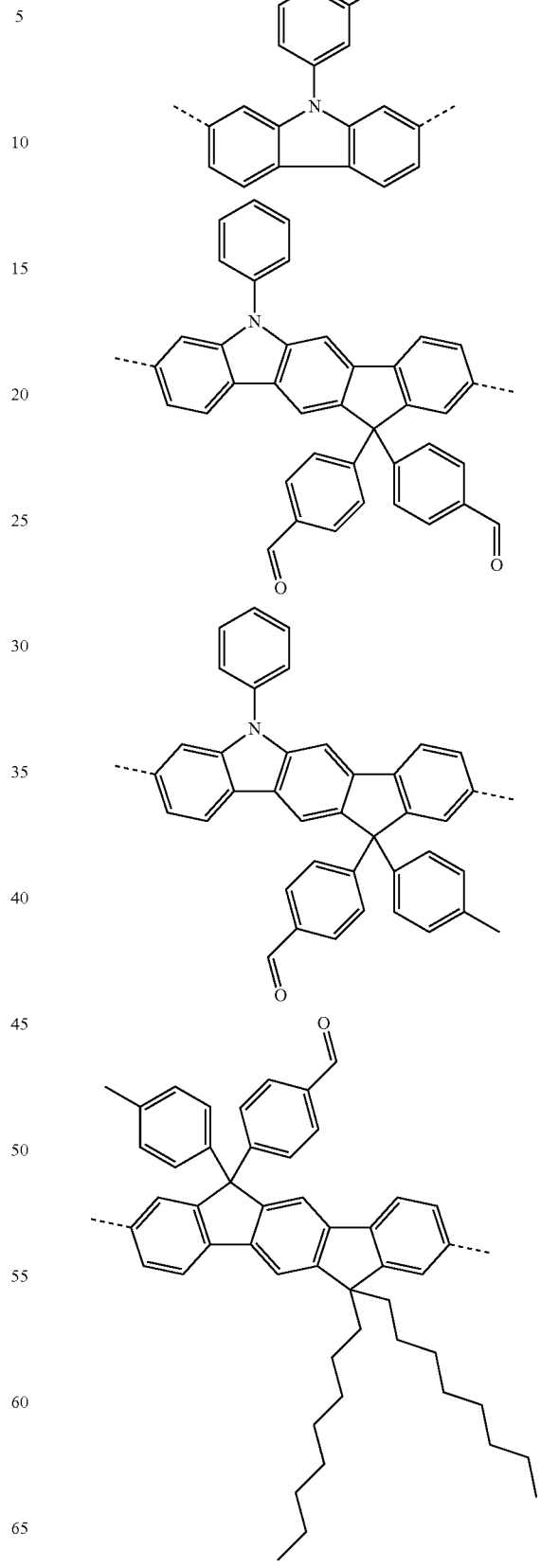

-continued
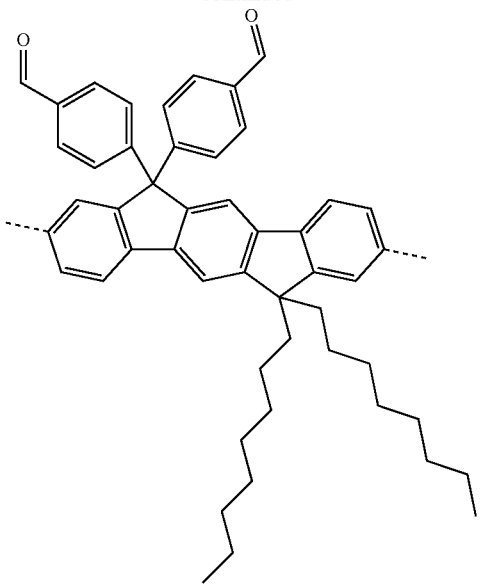
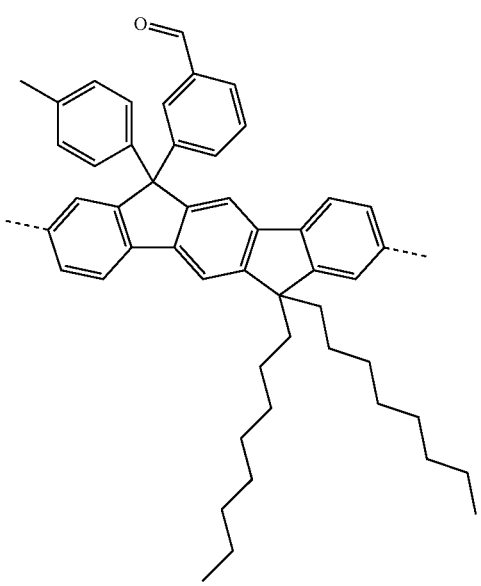
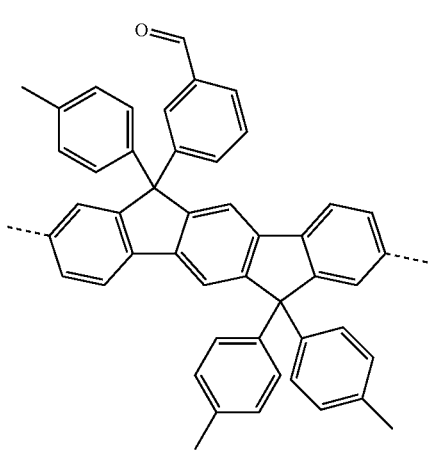
-continued
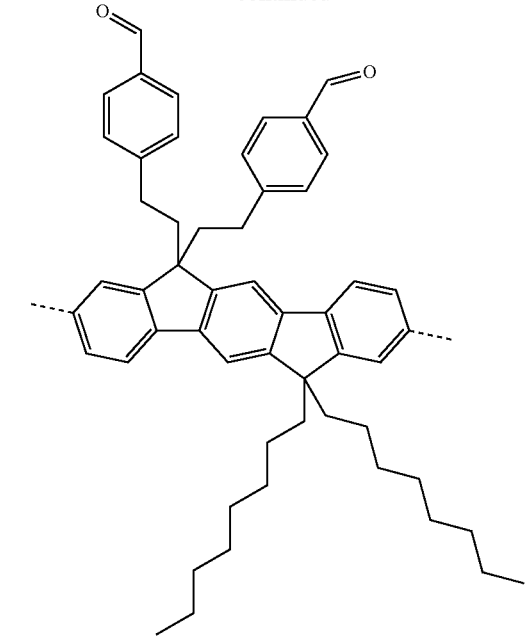
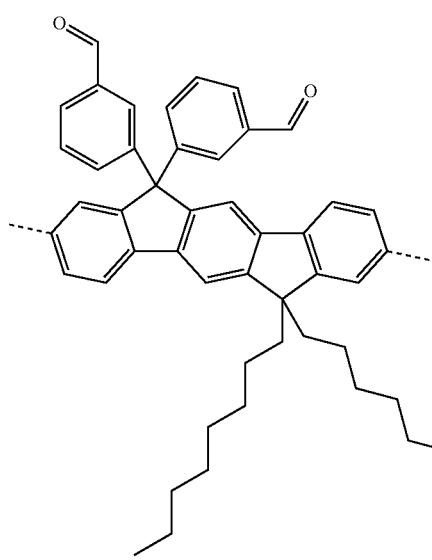
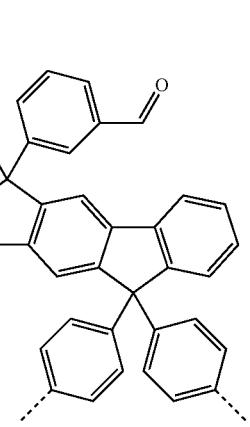

15
-continued
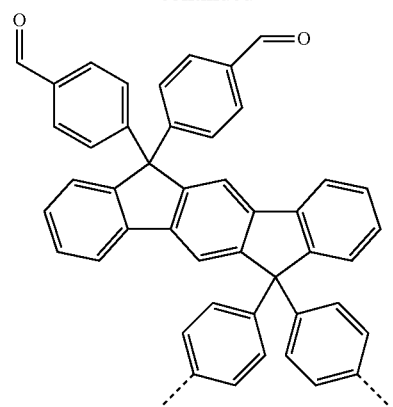
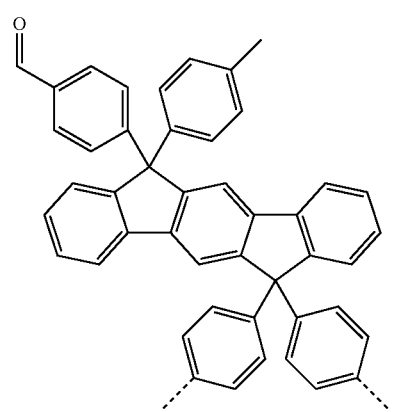
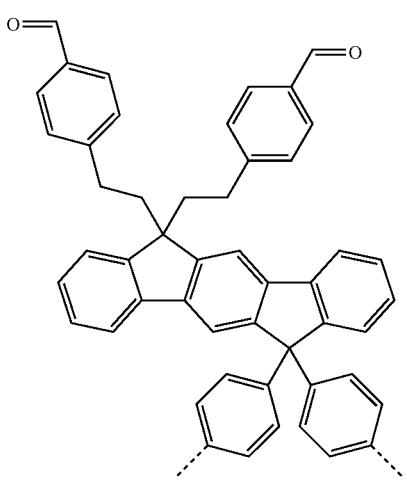
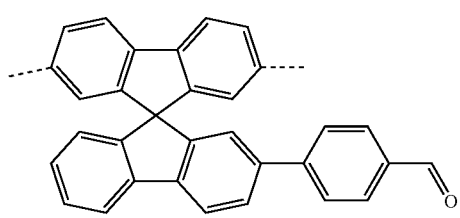
16
-continued
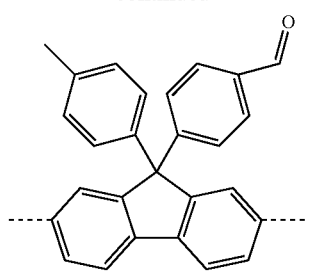
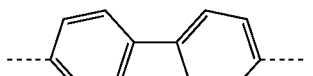
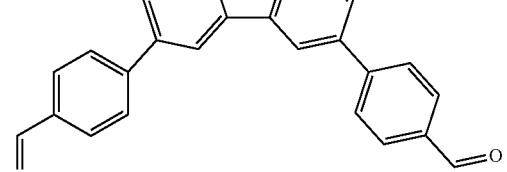
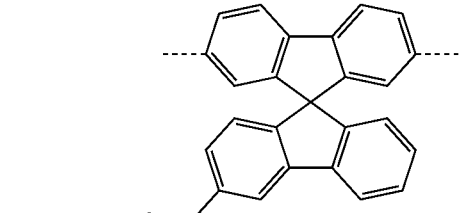
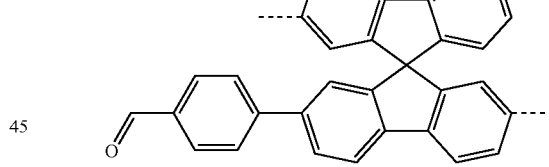
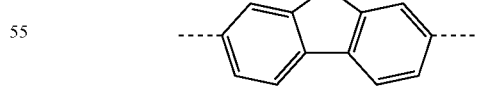
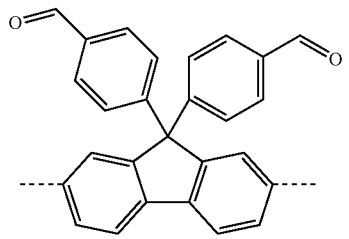

17
-continued
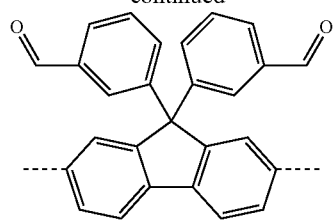
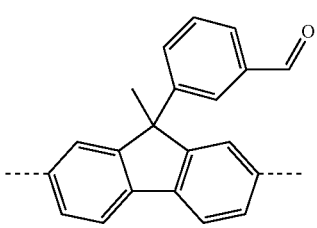
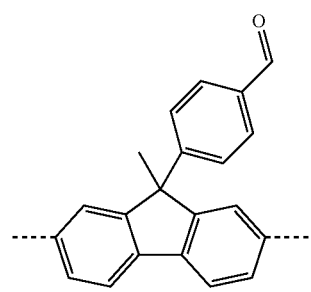
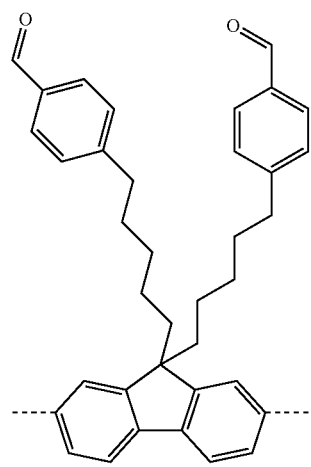
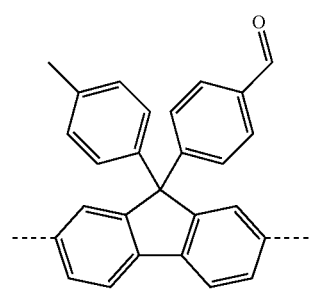
18
-continued
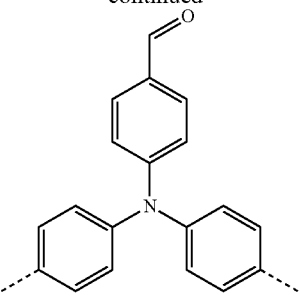
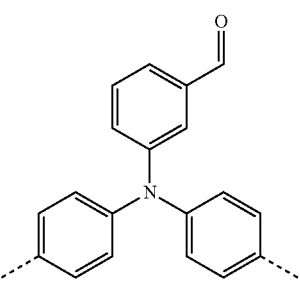
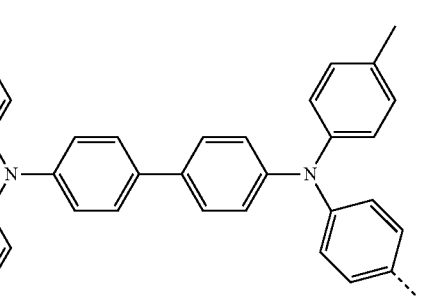
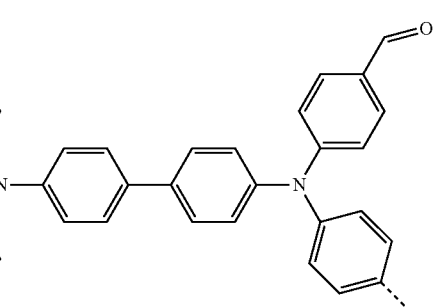
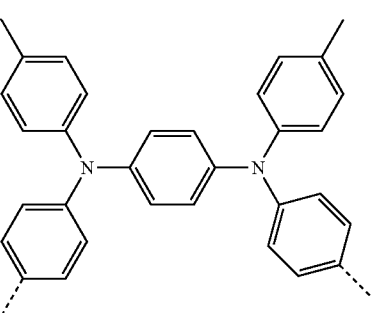

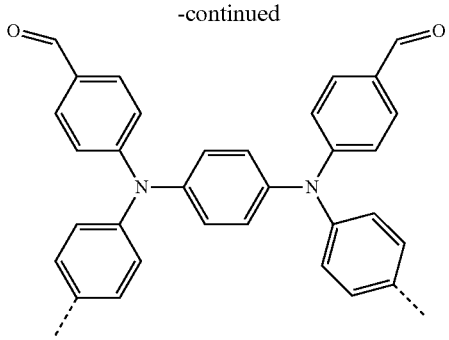

where the dashed lines represent a bond to a further structural unit in the polymer. The aromatic groups may in addition be substituted by one or more substituents.

The polymers according to the invention comprising structural units of the formula (I) and/or (II) which contain one or more aldehyde groups are generally prepared by polymerisation of one or more types of monomer, of which at least one monomer results in structural units of the formula (I) and/or (II) in the polymer. Suitable polymerisation reactions are known to the person skilled in the art and are described in the literature. Particularly suitable and preferred polymerisation reactions which result in C—C or C—N links are the following:
(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The C-C linking reactions are preferably selected from the groups of the SUZUKI coupling, the YAMAMOTO coupling and the STILLE coupling, and the C-N linking reaction is preferably a HARTWIG-BUCHWALD coupling.

The present invention thus also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

Monomers which can be converted into the polymers according to the invention by polymerisation are monomers which contain at each of the two ends a group selected, independently of one another, from the group consisting of halogen, preferably Br and I, O-tosylate, O-triflate, O—SO$_2$R$^1$, B(OR$^1$)$_2$ and Sn(R$^1$)$_3$.

R$^1$ is preferably selected on each occurrence, independently of one another, from the group consisting of hydrogen, an aliphatic hydrocarbon radical having 1 to 20 C atoms and an aromatic mono- or polycyclic ring system having 6 to 20 ring atoms, where two or more radicals R$^1$ can form a ring system with one another. Aliphatic hydrocarbons having 1 to 20 carbon atoms here are linear, branched or cyclic alkyl groups, alkenyl groups, alkynyl groups, in which one or more carbon atoms may be replaced by O, N or S. In addition, one or more hydrogen atoms may be replaced by fluorine.

Examples of aliphatic hydrocarbons having 1 to 20 carbon atoms include the following: methyl, ethyl, n-propyl, isopropyl, n-butyl, isobutyl, sec-butyl (1-methylpropyl), tert-butyl, isopentyl, n-pentyl, tert-pentyl (1,1-dimethylpropyl), 1,2-dimethylpropyl, 2,2-dimethylpropyl (neopentyl), 1-ethylpropyl, 2-methylbutyl, n-hexyl, isohexyl, 1,2-dimethylbutyl, 1-ethyl-1-methylpropyl, 1-ethyl-2-methylpropyl, 1,1,2-trimethylpropyl, 1,2,2-trimethylpropyl, 1-ethylbutyl, 1-methylbutyl, 1,1-dimethylbutyl, 2,2-dimethylbutyl, 1,3-dimethylbutyl, 2,3-dimethylbutyl, 3,3-dimethylbutyl, 2-ethylbutyl, 1-methylpentyl, 2-methylpentyl, 3-methylpentyl, cyclopentyl, cyclohexyl, cycloheptyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl and octynyl.

The term "mono- or polycyclic aromatic ring system having 6 to 20 ring atoms" regarding R$^1$ is intended to have the same meaning as defined above, where condensed aromatic systems are also preferred here. Preferred aromatic ring systems are naphthyl and phenyl, where phenyl is especially preferred.

In the case where two radicals R$^1$ form a ring system, these two linked radicals R$^1$ preferably represent a divalent aliphatic group having 2 to 8 carbon atoms. Examples thereof are compounds of the following formula —CH$_2$(CH$_2$)$_n$CH$_2$—, where n=0, 1, 2, 3, 4, 5 or 6, preferably 0, 1, 2 or 3.

In the case where more than two radicals R$^1$ form a ring system with one another, these radicals R$^1$ with one another represent a branched tri-, tetra-, penta- or polyvalent aliphatic group having 6 to 20 carbon atoms.

In a particularly preferred embodiment, the terminating groups of the monomers are selected, independently of one another, from Br, I and B(OR$^1$)$_2$.

The dendrimers according to the invention can be prepared by processes known to the person skilled in the art or analogously thereto. Suitable processes are described in the literature, such as, for example, in Frechet, Jean M. J.; Hawker, Craig J., "Hyperbranched polyphenylene and hyperbranched polyesters: new soluble, three-dimensional, reactive polymers", Reactive & Functional Polymers (1995), 26(1-3), 127-36; Janssen, H. M.; Meijer, E. W., "The synthesis and characterisation of dendritic molecules", Materials Science and Technology (1999), 20 (Synthesis of Polymers), 403-458; Tomalia, Donald A., "Dendrimer molecules", Scientific American (1995), 272(5), 62-6, WO 02/067343 A1 and WO 2005/026144 A1.

The present invention furthermore relates to the use of a polymer comprising structural units of the formula (I) and/or (II) which contain one or more aldehyde groups for the preparation of a crosslinkable polymer. The cross-linkable group is preferably a vinyl group or alkenyl group. The aldehyde groups of the polymer are converted into vinyl groups or alkenyl groups, preferably propenyl groups, by the WITTIG reaction or a WITTIG-analogous reaction.

The present invention thus also relates to a process which comprises the following steps:
(a) provision of polymers which comprise structural units of the formula (I) and/or (II) which contain one or more aldehyde groups; and
(b) conversion of the aldehyde groups into vinyl groups or alkenyl groups.

In the said process according to the invention, the chemical conversion of the aldehyde groups into vinyl groups or alkenyl groups is preferably carried out by the WITTIG reaction, a WITTIG-analogous reaction, the Emmons-Horner reaction, the Peterson reaction or the Tebbe methylenation.

Irrespective of whether they contain aldehyde groups or already contain vinyl or alkenyl groups, the polymers according to the invention can be used as the pure substance, but also as a mixture together with further polymeric, oligomeric, dendritic or low-molecular-weight substances of any desired type. In the present invention, low-molecular-weight substance is taken to mean compounds having a molecular weight in the range from 100 to 3000 g/mol, preferably 200 to 2000 g/mol. These further substances may, for example, improve the electronic properties or themselves emit. The term mixture is applied above and below to a mixture comprising at least one polymeric component. In this way, one or more polymer layers consisting of a mixture (blend) of one or more polymers according to the invention comprising a structural unit of the formula (I) and/or (II) and optionally one or more further polymers with one or more low-molecular-weight substances can be produced.

The present invention thus furthermore relates to a polymer blend comprising one or more polymers according to the invention and one or more further polymeric, oligomeric, dendritic and/or low-molecular-weight substances.

The invention furthermore relates to solutions and formulations comprising one or more polymers or mixtures according to the invention in one or more solvents. The way in which solutions of this type can be prepared is known to the person skilled in the art and is described, for example, in WO 02/072714 A1, WO 03/019694 A2 and the literature cited therein.

These solutions can be used to produce thin polymer layers, for example by area-coating processes (for example spin coating) or by printing processes (for example ink-jet printing).

Polymers comprising structural units of the formula (I) and/or (II) which contain one or more aldehyde groups are particularly suitable, after conversion of the aldehyde groups into alkenyl groups, preferably vinyl groups, for the production of films or coatings, in particular for the production of structured coatings, for example by thermal or light-induced in-situ polymerisation and in-situ crosslinking, such as, for example, in-situ UV photopolymerisation or photopatterning. It is possible here not only to use corresponding polymers as the pure substance, but also to use formulations or mixtures of these polymers as described above. These can be used with or without addition of solvents and/or binders. Suitable materials, processes and devices for the methods described above are described, for example, in WO 2005/083812 A2. Possible binders are, for example, polystyrene, polycarbonate, poly(meth)acrylates, polyacrylates, polyvinylbutyral and similar, opto-electronically neutral polymers.

Suitable and preferred solvents are, for example, toluene, anisole, xylene, methyl benzoate, dimethylanisole, mesitylene, tetralin, veratrol, tetrahydrofuran and chlorobenzene, and mixtures thereof.

The present invention furthermore relates to the use of a polymer which comprises structural units of the formula (I) and/or (II) which contain one or more aldehyde groups for the preparation of a crosslinked polymer. In other words, the aldehyde group of this polymer is either linked directly to a compound which is either already bonded to another polymer or can be bonded to a further polymer in the same or a similar manner, or is converted into a crosslinkable group, which subsequently reacts with further crosslinkable groups, giving a crosslinked polymer. The crosslinkable group is preferably a vinyl group or alkenyl group and is preferably incorporated into the polymer by the WITTIG reaction or a WITTIG-analogous reaction. If the cross-linkable group is a vinyl group or alkenyl group, the crosslinking can be carried out by free-radical or ionic polymerisation, which can be induced thermally or by radiation. Free-radical polymerisation induced thermally, preferably at temperatures of less than 250° C., particularly preferably at temperatures of less than 200° C., is preferred.

An additional styrene monomer is optionally added during the crosslinking process in order to achieve a higher degree of crosslinking. The proportion of added styrene monomer is preferably in the range from 0.01 to 50 mol %, particularly preferably 0.1 to 30 mol %, based on 100 mol % of all copolymerised monomers which are present as structural units in the polymer.

The present invention thus also relates to a process for the preparation of a crosslinked polymer which comprises the following steps:
(a) provision of polymers which comprise structural units of the formula (I) and/or (II) which contain one or more aldehyde groups;
(b) conversion of the aldehyde groups into vinyl groups or alkenyl groups; and
(c) free-radical or ionic crosslinking, preferably free-radical crosslinking, which can be induced either thermally or by radiation, preferably thermally.

The crosslinked polymers prepared by the process according to the invention are insoluble in all common solvents. In this way, it is possible to produce defined layer thicknesses, which are not dissolved or partially dissolved again by the application of subsequent layers.

The present invention thus also relates to a crosslinked polymer which is obtainable by the process indicated above. The crosslinked polymer is—as described above—preferably prepared in the form of a crosslinked polymer layer. A further layer of a polymer according to the invention which comprises a structural unit of the formula (I) and/or (II) can be applied to the surface of a crosslinked polymer layer of this type from a solvent using the techniques described above owing to the insolubility of the crosslinked polymer in all solvents.

The present invention also encompasses a so-called hybrid device, in which one or more polymer layers and layers produced by vapour-deposition of low-molecular-weight substances can occur.

The crosslinked polymer according to the invention can be used in electronic or opto-electronic devices or for the production thereof.

The present invention thus furthermore relates to the use of the crosslinked polymer according to the invention in electronic or opto-electronic devices, preferably in organic or polymeric organic electroluminescent devices (OLEDs, PLEDs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably in organic or polymeric organic electroluminescent devices (OLEDs, PLEDs), in particular in polymeric organic electroluminescent devices (PLEDs).

In the case of the hybrid device mentioned above, the term combined PLED/SMOLED (small molecule organic light emitting diode) systems is used in connection with organic electroluminescent devices.

The way in which OLEDs or PLEDs can be produced is known to the person skilled in the art and is described in detail, for example, as a general process in WO 2004/070772 A2, which should be adapted correspondingly for the individual case.

As described above, the polymers according to the invention are very particularly suitable as electroluminescent materials in PLEDs or displays produced in this way.

For the purposes of the present invention, electroluminescent materials are taken to mean materials which can be used as active layer. Active layer means that the layer is capable of emitting light on application of an electric field (light-emitting layer) and/or that it improves the injection and/or transport of positive and/or negative charges (charge-injection or charge-transport layer).

The present invention therefore also preferably relates to the use of the crosslinked polymer according to the invention in a PLED, in particular as electroluminescent material.

The present invention furthermore relates to electronic or opto-electronic components, preferably organic or polymeric organic electroluminescent devices (OLEDs, PLEDs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices and organic photoreceptors (OPCs), particularly preferably organic or polymeric organic electroluminescent devices, in particular polymeric organic electroluminescent devices, having one or more active layers, where at least one of these active layers comprises one or more polymers according to the invention. The active layer can be, for example, a light-emitting layer, a charge-transport layer and/or a charge-injection layer.

The present application text and also the examples below are principally directed to the use of the polymers according to the invention in relation to PLEDs and corresponding displays. In spite of this restriction of the description, it is possible for the person skilled in the art, without further inventive step, also to use the polymers according to the invention as semiconductors for the further uses described above in other electronic devices.

The following examples are intended to explain the invention without restricting it. In particular, the features, properties and advantages discussed therein of the defined compounds on which the relevant example is based can also be applied to other compounds which are not described in detail, but fall within the scope of protection of the Claims, unless stated otherwise elsewhere.

EXAMPLES

Example 1

Preparation of a Monomer Used for the Preparation of an Interlayer Polymer According to the Invention.

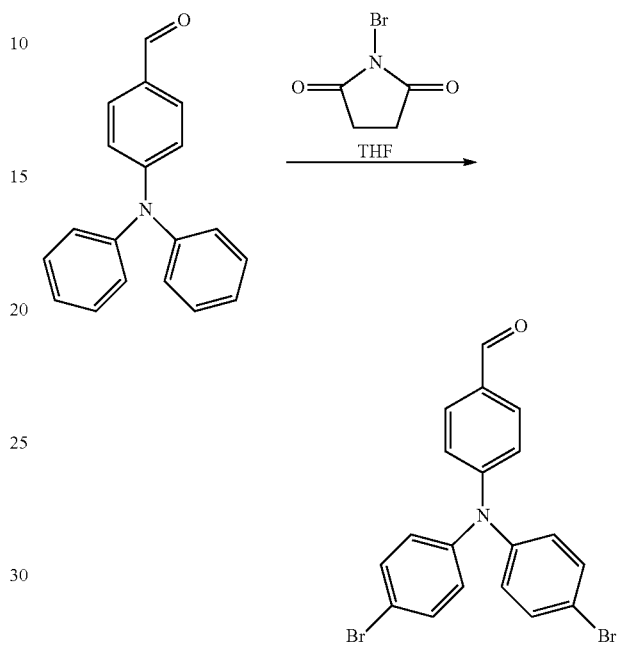

5 g of 4-(N,N-diphenylamino)benzaldehyde (18.3 mmol) are dissolved in 270 ml of dried THF and cooled to 0° C. 6.5 g of N-bromosuccinimide (36.6 mmol) are added successively as solid, and the solution is left to stir at 0° C. for 4 hours.

The solid is filtered off, and water and dichloromethane are added to the solution. The phases are separated. The organic phase is washed three times with water and dried over $Na_2SO_4$, then filtered and evaporated in a rotary evaporator. The product is recrystallised a number of times from heptane/toluene.

$^1$H NMR (CDCl$_3$, δ (ppm), J (Hz)): 7.02 (d, 4H, J=8.8), 7.04 (d, 2H, J=8.8), 7.44 (d, 4H, J=8.9), 7.71 (d, 2H, J=8.8), 9.84 (s, 1H)

Example 2

Preparation of a monomer used for the preparation of a matrix polymer according to the invention.

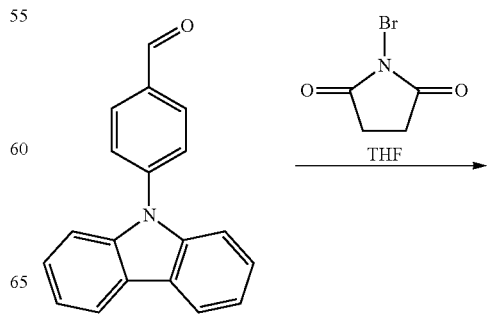

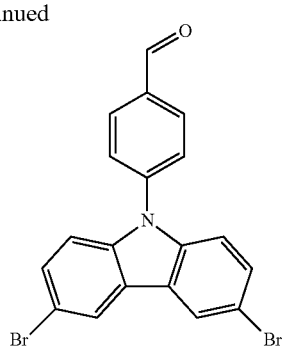

4.9 g of N-(4-formylphenyl)carbazole (18.1 mmol) are dissolved in 270 ml of dried THF and cooled to 0° C. 6.4 g of N-bromosuccinimide (36.1 mmol) are added successively as solid, and the solution is left to stir at 0° C. for 4 hours.

The solid is filtered off, and water and dichloromethane are added to the solution. The phases are separated. The organic phase is washed three times with water and dried over Na$_2$SO$_4$, then filtered and evaporated in a rotary evaporator. The product is recrystallised a number of times from ethyl acetate.

$^1$H NMR (C$_2$D$_2$Cl$_4$, δ (ppm), J (Hz)): 7.34 (d, 2H, J=8.6), 7.55 (d, 2H, J=8.8), 7.71 (d, 2H, J=8.3), 8.13 (d, 2H, J=8.6), 8.21 (s, 2H), 10.10 (s, 1H)

Example 3a

Preparation of Polymers P1a, P1b and P1c, and P2a, P2b and P2c According to the Invention Using the Monomers Prepared in Examples 1 and 2.

Polymers P1 and P2 according to the invention are prepared from the three different structural units shown below by SUZUKI coupling by the process described in WO 03/048225. Polymers P1a, P1b and P1c, and P2a, P2b and P2c prepared in this way comprise the three structural units in the percentage proportions indicated (per cent data=mol %) after removal of the leaving groups.

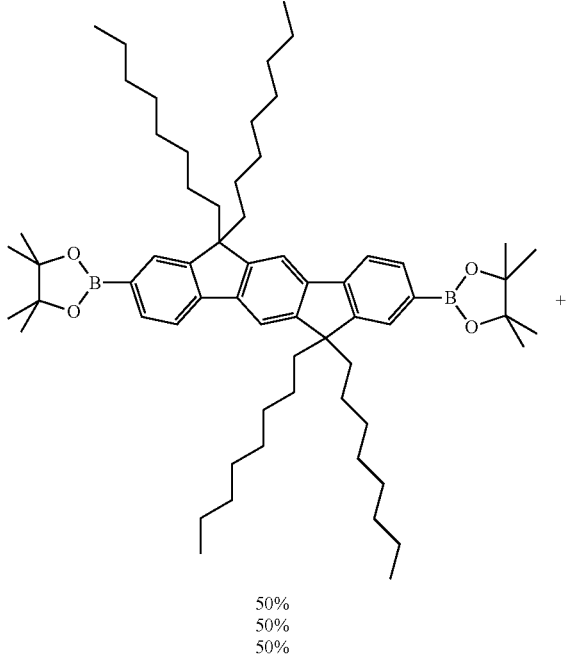

50%
50%
50%

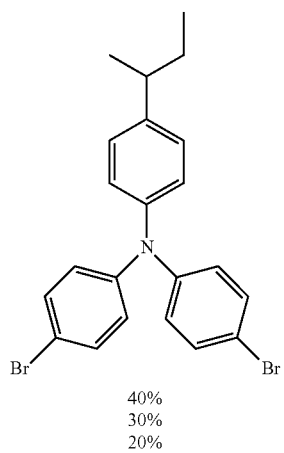

40%
30%
20%

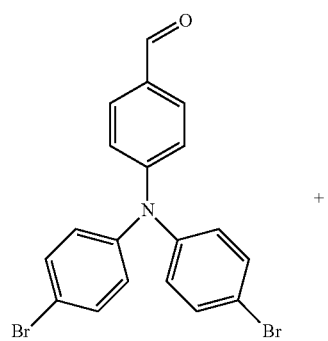

P1a 10%
P1b 20%
P1c 30%

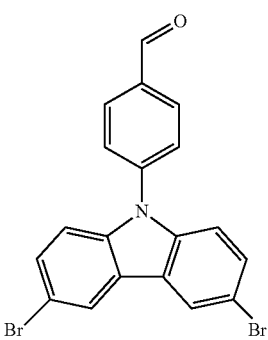

P2a 10%
P2b 20%
P2c 30%

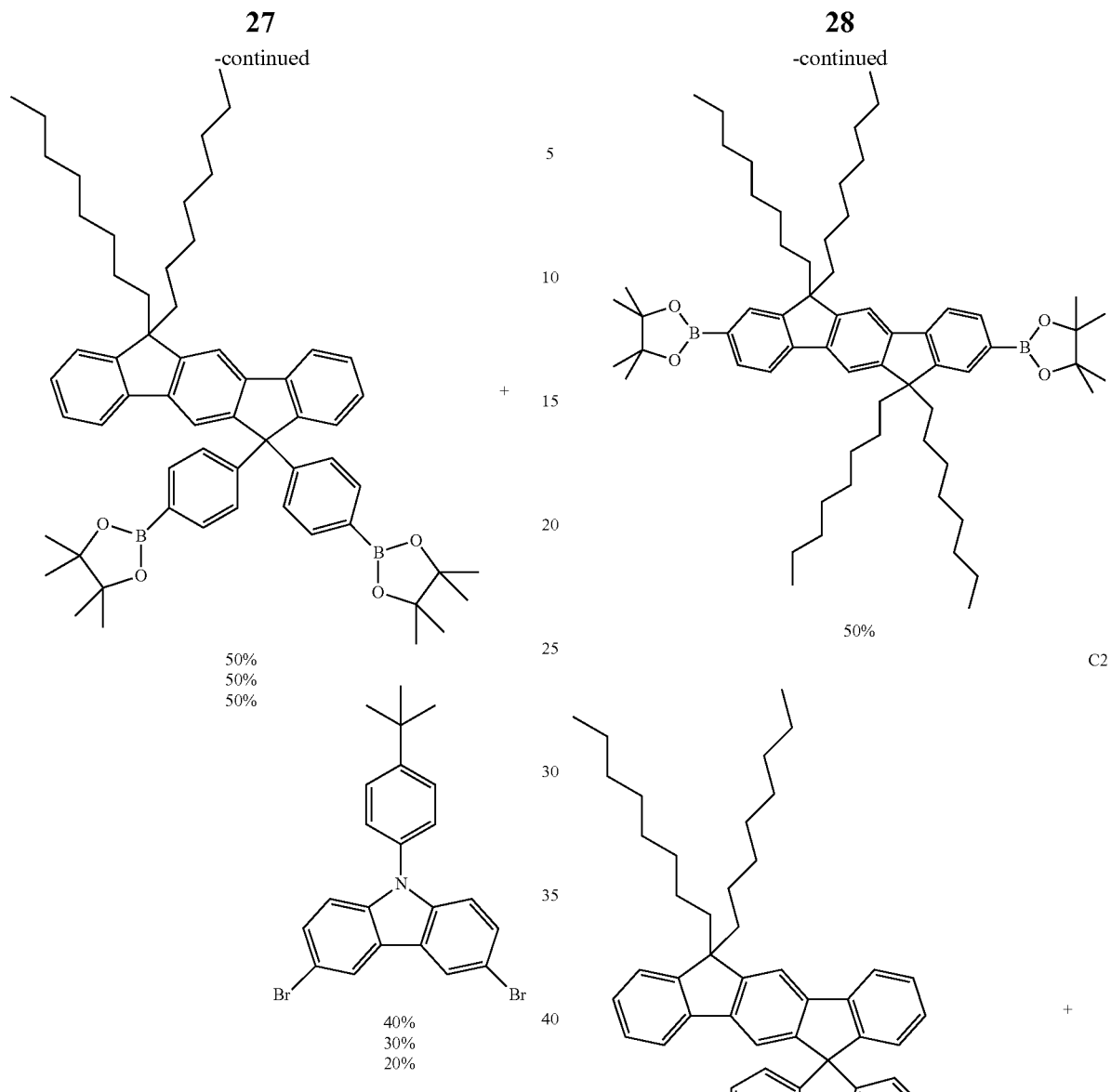
Example 3b
Preparation of Comparative Polymers C1 and C2 Which Comprise the Two Structural Units Shown Below in the Percentage Proportions Indicated (Per Cent Data=Mol %) After Removal of the Leaving Groups by the Same Process as Described in Example 3a:
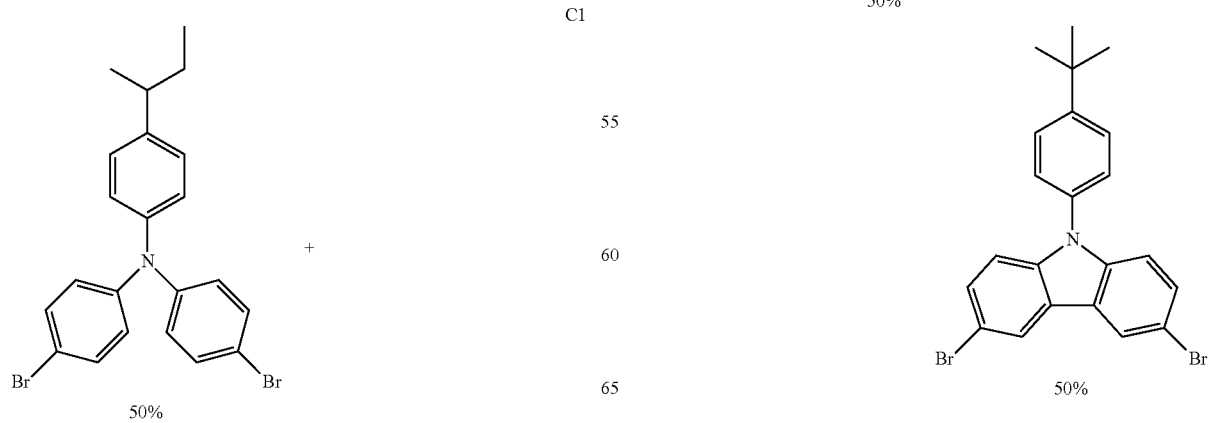

Example 4

Introduction of Crosslinkable Groups Into Polymers P1 and P2 Prepared In Accordance With Example 3a.

Polymers P1a', P1b' and P1c', and P2a', P2b' and P2c' containing cross-linkable groups are prepared from polymers P1a, P1b and P1c, and P2a, P2b and P2c prepared in accordance with Example 3a by Wittig reaction in accordance with the following reaction schemes:

Wittig Reaction of P1:

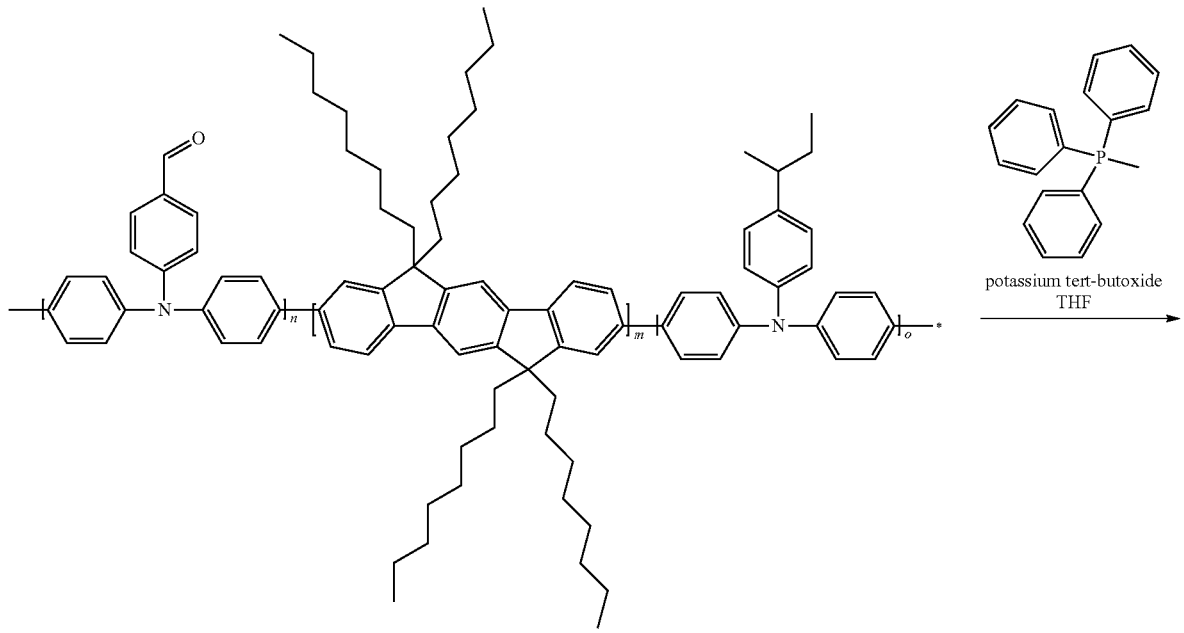

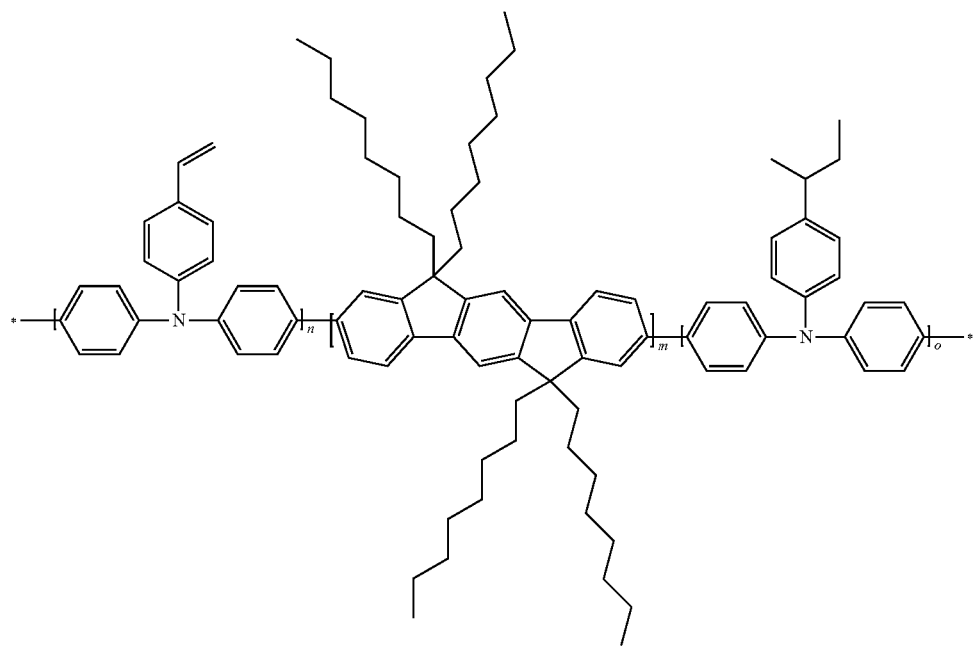

Wittig Rreaction of P2:

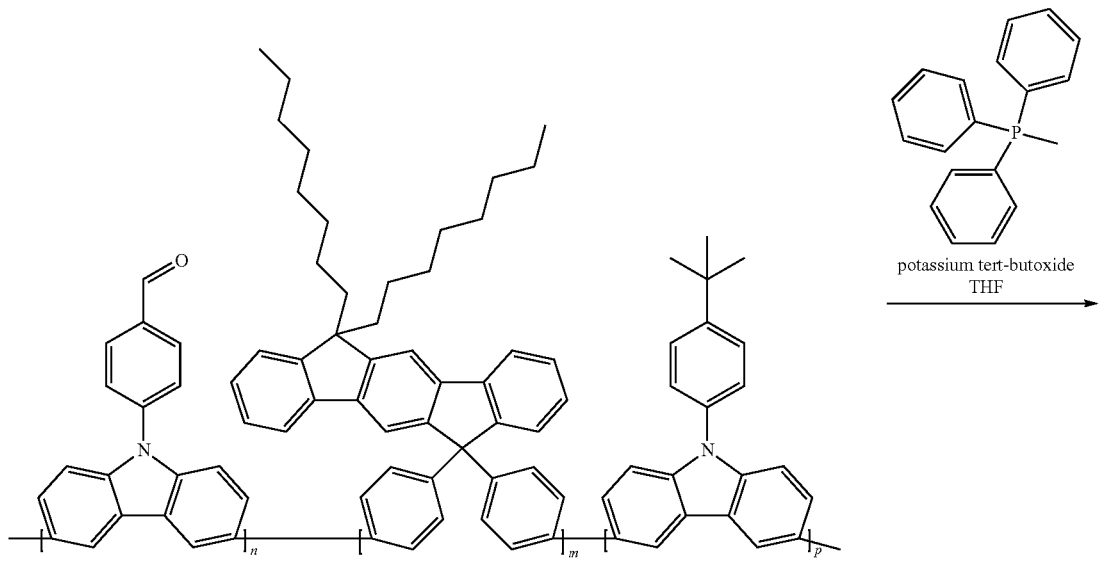

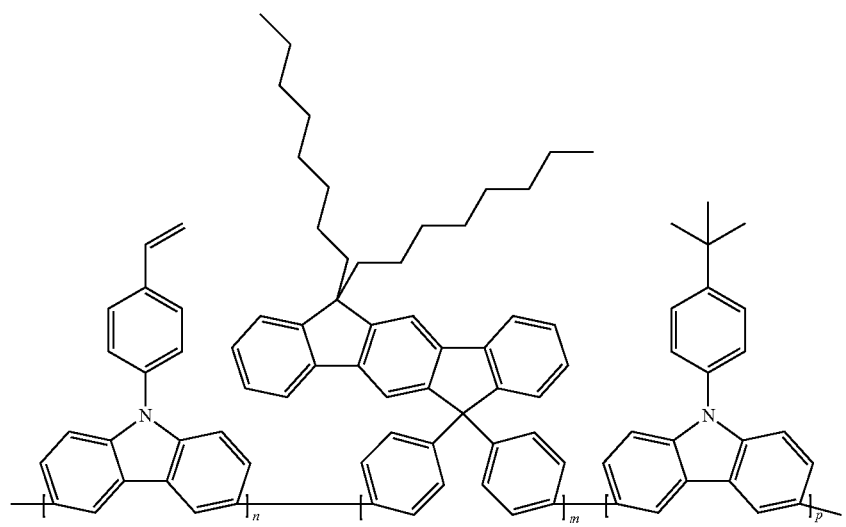

To this end, polymer P1a (1 g) is dissolved in 20 ml of dried THF at 50° C. under argon and subsequently cooled to room temperature. 2.86 g (8 mmol) of methyltriphenylphosphonium bromide are dissolved in 20 ml of dried THF at 0° C. under argon, and 0.90 g (8 mmol) of potassium tert-butoxide is added in portions at 0° C. The polymer solution is subsequently added slowly at 2° C. using a syringe, and the mixture is left to stir overnight at room temperature. The solution is extracted three times with water, and the organic phase is precipitated in methanol.

Polymers P1b and P1c, and P2a, P2b and P2c are reacted analogously.

Example 5

Production of a Green-Emitting PLED Comprising Comparative Polymers C1 and C2 From Example 3b.

The production of a polymeric light-emitting diode has already been described a number of times in the patent literature (see, for example, WO 2004/037887). In order to explain the present invention by way of example, a PLED is produced by the process described in WO 2004/037887 using comparative polymer C1 by spin coating onto an ITO substrate which has been coated in advance with PEDOT (PEDOT is a polythiophene derivative (Baytron P, from H. C. Starck, Goslar)). The coated substrate is dried by heating at 180° C. for 10 minutes. The layer thickness of the resultant inter-layer is 20 nm. 80 nm of an emitting layer consisting of a polymer matrix C2 and a green-phosphorescent triplet emitter T1 (about 20 mol %) are then applied by spin coating. A Ba/Al cathode (metals from Aldrich) is then applied by vapour deposition, and the PLED is encapsulated and characterised electro-optically. Table 1 shows the results obtained.

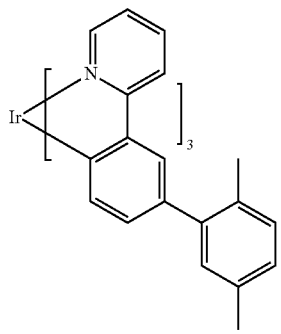

T1

Example 6

Production of Various Green-Emitting PLEDs Having Crosslinked Polymer Layers Using Polymers P1a' and P2a', P2b' and P2c' From Example 3a.

The production is carried out as described in Example 5, using polymer P1a' instead of comparative polymer C1 and using polymers P2a', P2b' and P2c' instead of comparative polymer C2. After the spin coating, the coating is in each case dried by heating at 180° C. for one hour in the case of P1' and P2' in order to crosslink the polymers. The layer thickness of the interlayer comprising polymer P1a' is 20 nm, and the layer thickness of the emitting layer comprising polymers C2, P2a', P2b' and P2c' is in each case 80 nm. The electro-optical characterisation of the PLEDs is carried out as in Example 5 and is described below. The results are summarised in Table 1.

Electro-Optical Characterisation:

For the electro-optical characterisation, the PLEDs produced in Examples 5 and 6 are clamped in holders manufactured specifically for the substrate size, and provided with spring contacts. A photodiode with eye response filter can be placed directly on the measurement holder in order to exclude influences from extraneous light.

The voltages are typically increased from 0 to max. 20 V in 0.2 V steps and reduced again. For each measurement point, the current through the PLED and the photocurrent obtained are measured by the photodiode. In this way, the IUL data of the test PLED are obtained. Important parameters are the maximum efficiency measured ("eff." in cd/A) and the voltage required for 100 cd/m$^2$ ($U_{100}$).

In order, in addition, to know the colour and the precise electroluminescence spectrum of the test PLED, the voltage required for 100 cd/m$^2$ is again applied after the first measurement, and the photodiode is replaced by a spectrum measurement head. This is connected to a spectrometer (Ocean Optics) by an optical fibre. The colour coordinates (CIE: Commission International de l'éclairage, standard observer from 1931) can be derived from the measured spectrum.

TABLE 1

Results of electro-optical characterisation of green-emitting PLEDs.

| Interlayer polymer | Matrix polymer | Max. eff. [cd/A] | U@100 cd/m$^2$ [V] | CIE [x/y] |
|---|---|---|---|---|
| C1 | C2 | 15.0 | 9.1 | 0.35/0.61 |
| P1a' | C2 | 15.2 | 9.7 | 0.34/0.62 |
| P1a' | P2a' | 15.4 | 9.5 | 0.35/0.63 |

TABLE 1-continued

Results of electro-optical characterisation of green-emitting PLEDs.

| Interlayer polymer | Matrix polymer | Max. eff. [cd/A] | U@100 cd/m$^2$ [V] | CIE [x/y] |
|---|---|---|---|---|
| P1a' | P2b' | 14.7 | 9.3 | 0.35/0.62 |
| P1a' | P2c' | 14.5 | 9.5 | 0.36/0.61 |

The efficiency of the PLEDs comprising crosslinked interlayer and/or matrix polymers P1a' and P2a-c' is comparable with the efficiency of the PLEDs comprising uncrosslinked comparative polymers C1 and C2. The voltage and colour coordinates are likewise comparable. This shows that crosslinking has no adverse effects on efficiency, voltage and colour coordinates. However, a major advantage is that crosslinking of the polymers according to the invention allows the layer thickness to be varied specifically and controlled precisely, since the crosslinked layer can no longer be partially dissolved and washed off, which is explained in greater detail in Example 8. Thus, a multilayered structure is achieved in a PLED in which all layers are processed from solution and have a defined layer thickness. In the present case, for example, it is also possible to apply a third layer of defined layer thickness to the crosslinked green-emitting layer (P2' comprising 20 mol % of T1) before the cathode is applied by vapour deposition and the PLED is encapsulated. If the third layer is likewise crosslinkable, a fourth layer of defined layer thickness can be applied.

Example 7

Production of Various Blue-Emitting Pleds Using Polymers P1a', P1b' and P1 c', and the Crosslinking Thereof.

The production is carried out analogously to Examples 5 and 6. Polymers C1, P1a', P1b' and P1c' are applied by spin coating to ITO substrates which have been coated in advance with PEDOT. The substrates coated with P1a', P1b' and P1c' are subsequently each dried by heating at 180° C. for one hour in order to crosslink the polymers. The thickness of the polymer layer is in each case 20 nm. A layer of a blue-emitting polymer B1 with a thickness of 65 nm is then applied by spin coating. (The preparation of B1 is carried out analogously to Example 3. B1 comprises the structural units shown below in the percentage proportions indicated (per cent data=mol %) after removal of the leaving groups.)

B1:

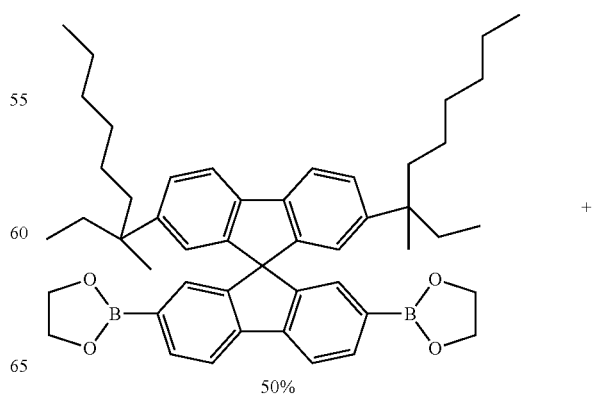

50%

-continued

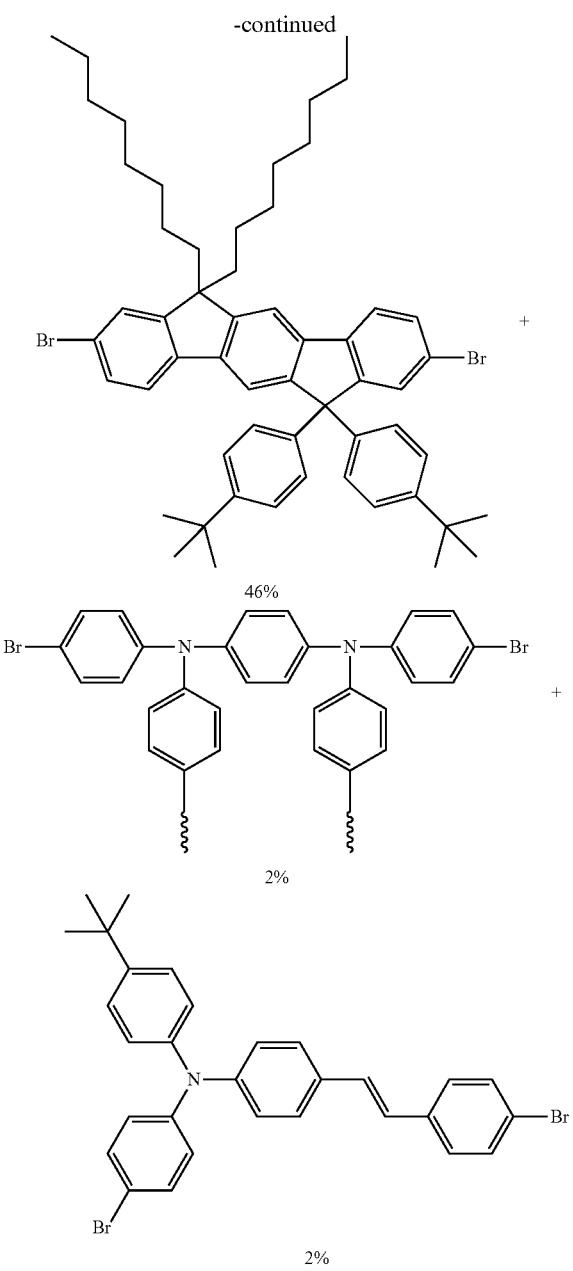

A Ba/Al cathode is subsequently applied by vapour deposition, and the PLED is encapsulated. The electro-optical characterisation of the PLED is carried out as described in Example 6. The results are summarised in Table 2.

TABLE 2

Results of electro-optical characterisation of blue-emitting PLEDs.

| Interlayer polymer | Max. eff. [cd/A] | U@100 cd/m² [V] | CIE [x/y] |
|---|---|---|---|
| C1 | 6.04 | 2.9 | 0.15/0.23 |
| P1a' | 5.92 | 2.8 | 0.15/0.23 |
| P1b' | 5.68 | 2.9 | 0.15/0.26 |
| P1c' | 5.69 | 2.9 | 0.15/0.24 |

The efficiency of the PLEDs comprising crosslinked polymers P1a', P1b' and P1c' is comparable with that of uncrosslinked comparative polymer C1. Voltage and colour coordinates are likewise comparable. This shows that crosslinking of the interlayer has no adverse effects on efficiency, voltage and colour coordinates of the PLED. However, a major advantage is that crosslinking of the polymers according to the invention allows the layer thickness to be varied specifically and controlled precisely, since the crosslinked layer can no longer be partially dissolved and washed off, which is explained in greater detail in Example 8. Thus, a multilayered structure comprising at least two layers is achieved in a PLED processed from solution in which the layers have a defined layer thickness.

Example 8

Control of the Layer Thicknesses

Polymers C1, C2, P1a', P1b', P1c', P2a', P2b' and P2c' are spin-coated onto glass supports in layer thicknesses as described in Table 2. The layer thickness is measured by scratching the polymer layer with a needle, with the scratch extending down to the glass substrate. The depth of the scratch and thus the polymer layer thickness is subsequently measured twice at at least two points each with the aid of an AFM (atomic force microscopy) needle, and the average is formed (Table 3). In the case of polymers P1' and P2' according to the invention, the polymer film is dried by heating at 180° C. for one hour in order to crosslink the film. In the case of comparative polymers C1 and C2, the polymer film is dried by heating at 180° C. for 10 minutes. All polymer films are then washed with toluene for one minute on the spin coater (speed of rotation 1000 rpm), and the film is again dried by heating at 180° C. for 10 minutes in order to remove the solvent. The layer thickness is subsequently measured again as described above in order to check whether the layer thickness has changed (Table 3). If the layer thickness is not reduced, the polymer is insoluble and the crosslinking is thus adequate.

TABLE 3

Layer-thickness measurements on crosslinked and uncrosslinked polymers before and after washing with toluene.

| Polymer | Measured layer thickness before crosslinking* and washing process (nm) | Measured layer thickness after crosslinking* and washing process (nm) | Remaining layer thickness after crosslinking* and washing process [%] |
|---|---|---|---|
| P1a' | 20 | 19 | 95 |
| P1a' | 39 | 33 | 85 |
| P1b' | 21 | 20 | 95 |
| P1c' | 20 | 19 | 95 |
| P1c' | 43 | 40 | 93 |
| P2a' | 80 | 70 | 88 |
| P2b' | 80 | 73 | 92 |
| P2c' | 80 | 76 | 95 |
| C1 | 20 | 4 | 20 |
| C1 | 40 | 5 | 13 |
| C2 | 80 | 5 | 6 |

*Crosslinking only in the case of P1a-c' and P2a-c'

The results show that the crosslinking of the polymers according to the invention is virtually quantitative. The higher the proportion of crosslinking groups, the more insoluble the polymer after crosslinking. In the case of a small layer thickness of 20 nm, a crosslinkable monomer proportion in the polymer of only 10% is sufficient for the layer to be adequately crosslinked and not washed out. 95% of the layer thickness originally applied (P1') remain, compared with 20% in the case of an uncrosslinkable polymer (C1). In the case of layer thicknesses of 80 nm, a proportion of 10% of crosslink-able monomer units in the polymer already exhibits a significant improvement. After washing, about 88% of the layer thickness of the crosslinked polymer (P2a') remain instead of 6% in the case of the corresponding uncrosslinkable polymer (C2). In the case of ≥20% of crosslinkable monomer units in the polymer, >90% of the layer thickness originally applied remain (P2b', P2c'). It is thus possible to control the layer thickness in the case of the crosslinkable polymers according to the invention.

The invention claimed is:

1. A process for the preparation of a crosslinked polymer which comprises the following steps:
(a) providing a polymer which comprises at least one structural unit of the following formula (I):

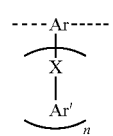

formula (I)

wherein at least one representative from Ar and Ar' contains an aldehyde group,
where the symbols and indices used have the following meanings:
Ar and Ar' represent, independently of one another, a substituted or unsubstituted, mono- or polycyclic, aromatic or heteroaromatic ring system;
X represents a covalent single bond or a straight-chain, branched or cyclic $C_{1-10}$-alkylene, $C_{1-10}$-alkenylene or $C_{1-10}$-alkynylene group, in which one or more H atoms is optionally replaced by F and in which one or more $CH_2$ groups is optionally replaced by O, NH or S; and
n is 1, 2, 3 or 4; and
the dashed lines represent bonds to the next structural unit of the polymer;
(b) conversion of the aldehyde groups into vinyl groups or alkenyl groups; and
(c) crosslinking of the polymer.

2. The process according to claim 1, wherein Ar' is a substituted or unsubstituted unit selected from the group consisting of the following:
phenylene, biphenylene, triphenylene, 1,1':3',1''-terphenyl-2'-ylene, naphthylene, anthracene, binaphthylene, phenanthrene, dihydrophenanthrene, pyrene, dihydropyrene, chrysene, perylene, tetracene, pentacene, benzo[a]pyrene, fluorene, indene, indenofluorene, spirobifluorene, pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene and benzothiadiazothiophene.

3. The process according to claim 1, wherein the structural unit of the formula (I) is a structural unit of the following formula (II):

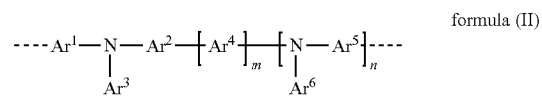

formula (II)

wherein at least one Ar of the units $Ar^1$ to $Ar^6$ contains an aldehyde group,
where the symbols and indices used have the following meanings:
$Ar^1$ to $Ar^6$ are identical or different and represent, independently of one another, a substituted or unsubstituted, mono- or polycyclic, aromatic or heteroaromatic ring system having 5 to 25 ring atoms;
m is 0 or 1;
n is 0, 1 or 2;
the dashed lines represent bonds to the next structural unit of the polymer;
with the proviso that, if n=1, the two N atoms bond to different C atoms of the same aromatic ring system.

4. The process according to claim 3, wherein Ar in the formula (I) or $Ar^1$, $Ar^2$, $Ar^4$ and $Ar^5$ in the formula (II) is (are) a substituted or unsubstituted unit selected from the group consisting of the following: 4,5-dihydropyrene, 4,5,9,10-tetrahydrofluorene, 9,9'-spirobifluorene, fluorene, phenanthrene, 9,10-dihydrophenanthrene, 5,7-dihydrodibenzoxepine, cis-indenofluorene, trans-indenofluorene, phenylene, thiophene, benzanthracene, carbazole, benzimidazole, oxepine and triazine.

5. The process according to claim 3, wherein the polymer comprises a further structural unit which is different from the structural unit of the formula (I) and/or (II).

6. The according to claim 5, wherein the further structural unit is a structural unit of the formula (I) and/or (II) which does not contain an aldehyde group.

7. The process according to claim 3, wherein Ar' in formula (I) or $Ar^3$ and/or $Ar^6$ in formula (II) contains an aldehyde group.

8. The process according to claim 3, wherein the structural unit of the formula (II) is selected from the following structural units:

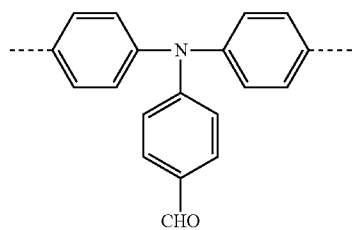

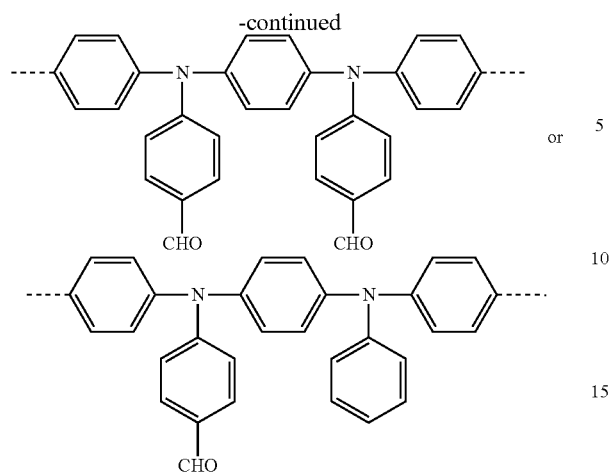
or
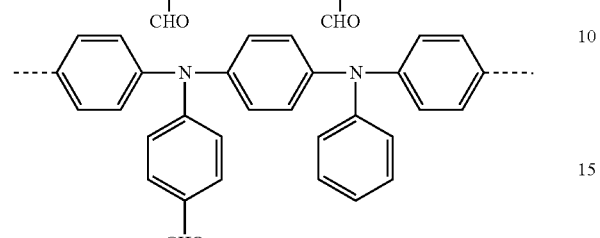
* * * * *